(12) United States Patent
Furuta et al.

(10) Patent No.: US 8,908,345 B2
(45) Date of Patent: Dec. 9, 2014

(54) SEMICONDUCTOR DEVICE

(75) Inventors: Futoshi Furuta, Kokubunji (JP);
Kenichi Osada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 354 days.

(21) Appl. No.: 13/332,861

(22) Filed: Dec. 21, 2011

(65) Prior Publication Data

US 2012/0162836 A1    Jun. 28, 2012

(30) Foreign Application Priority Data

Dec. 22, 2010   (JP) .................. 2010-286163

(51) Int. Cl.
*H01L 27/02*    (2006.01)
*H02H 9/04*    (2006.01)
*H01L 25/065*    (2006.01)
*H01L 23/62*    (2006.01)
*H01L 23/48*    (2006.01)

(52) U.S. Cl.
CPC ............ *H01L 25/0657* (2013.01); *H01L 23/62* (2013.01); *H01L 23/481* (2013.01); *H02H 9/046* (2013.01); *H01L 2225/06517* (2013.01); *H01L 2225/06513* (2013.01); *H01L 2225/06541* (2013.01); *H01L 2225/06565* (2013.01); *H01L 2224/16145* (2013.01); *H01L 2224/16225* (2013.01); *H01L 2924/15311* (2013.01)
USPC .......... 361/91.5; 257/773; 257/774; 257/759; 257/723; 257/725

(58) Field of Classification Search
CPC ......... H01L 27/0255; H02H 9/04; G11C 5/04
USPC .......... 361/91.5; 257/773, 774, 759, 723, 725
See application file for complete search history.

(56) References Cited

U.S. PATENT DOCUMENTS

| 5,731,945 | A | 3/1998 | Bertin et al. |
| 6,864,941 | B2 * | 3/2005 | Yano .............................. 349/149 |
| 7,308,656 | B1 * | 12/2007 | Roberts et al. ................ 716/103 |
| 7,589,945 | B2 * | 9/2009 | Miller et al. .................... 361/56 |
| 2007/0005876 | A1 | 1/2007 | Ikeda et al. |

(Continued)

FOREIGN PATENT DOCUMENTS

| JP | 9-92781 A | 4/1997 |
| JP | 2006-330974 A | 12/2006 |

(Continued)

OTHER PUBLICATIONS

Kenji Takahashi et al., "Current Status of Research and Development for Three-Dimensional Chip Stack Technology" Japanese Journal of Applied Physics, vol. 40, (2001) pp. 3032-3037.

*Primary Examiner* — Zeev V Kitov
(74) *Attorney, Agent, or Firm* — Miles & Stockbridge P.C.

(57) ABSTRACT

In a stacked chip system, an IO circuit connected to a TSV pad for IO and a switch circuit constitute an IO channel in each chip, the IO channels as many as the maximum scheduled number of stacks are coupled together and connected to constitute an IO group, and the chip has one or more such IO groups. Each TSV pad for IO is connected with a through via to an IO terminal at the same position in a chip of another layer. On an interposer, if the actual number of stacks is less than the maximum scheduled number of stacks, connection pads for IO in adjacent IO groups on the interposer are connected via a conductor.

18 Claims, 9 Drawing Sheets

(56) References Cited

U.S. PATENT DOCUMENTS

2010/0078635 A1   4/2010   Kuroda et al.
2010/0200998 A1   8/2010   Furuta et al.
2011/0016266 A1   1/2011   Asano et al.

FOREIGN PATENT DOCUMENTS

| JP | 2009-295750 A | 12/2009 |
| JP | 2010-080801 A | 4/2010 |
| JP | 2010-186764 A | 8/2010 |

* cited by examiner

SEMICONDUCTOR DEVICE

CROSS-REFERENCE TO RELATED APPLICATION

The present application claims priority from Japanese Patent Application No. 2010-286163 filed on Dec. 22, 2010, the content of which is hereby incorporated by reference into this application.

TECHNICAL FIELD OF THE INVENTION

The present invention relates to a semiconductor device in which semiconductor integrated circuit chips (simply abbreviated as chips or circuit chips) in which a microprocessor and a memory are integrated are stacked, and in particular to a technology effectively applied to a connecting technology of a plurality of semiconductor integrated circuit chips.

BACKGROUND OF THE INVENTION

For example, in the technologies relating to semiconductor devices, a main feature of a C-MOS semiconductor circuit lies in the scaling law in which microfabrication of elements improves operating speed and reduces power consumption. Until now, the integration degree and performance per chip have been improved by the microfabrication of elements. However, as the elements are more microfabricated, a tendency in which the improvement in the integration degree and chip performance is slowing down has appeared. Reasons for this include limitations of microfabrication itself, a manifestation of wiring delay among elements due to an improvement in element speed, and an increase in power consumption due to leakage problems caused by the element microfabrication.

On the other hand, when an information processing system of a predetermined scale is to be constructed, since functions that can be integrated on one chip are limited, it is necessary to arrange a plurality of chips and to connect these chips. So far, the direction of arranging chips is horizontal, and a distance of signal transmission among the chips is equal to or longer than one side of a chip. For this reason, even if microfabrication improves the operating speed per chip, transmission among the chips still takes time, and it is therefore difficult to improve the speed as a whole system.

Thus, in order to solve the slowdown in improvement of chip performance and to improve the performance of the entire system, stacked chip systems typified by those described in Japanese Journal of Applied Physics, 40, pp. 3032-3037 (2001) by K. Takahashi et al. (Non-Patent Document 1) and Japanese Unexamined Patent Application Publication No. 2006-330974 (Patent Document 1) have been suggested. This stacked chip system has a structure in which another circuit chip is stacked above and below a circuit chip in a longitudinal direction and the stacked chips are placed on an interposer. In this technology, information and electric power are transmitted among the chips with through vias buried in the chips, through silicon via (TSV) pads, and bumps connecting the chips. By connecting long-distance wirings for signals in the chips and signal wirings among the chips with through vias each straight above the chips, a significant reduction in wiring delay between elements in the chip and interchip transmission delay, which is a bottleneck in the entire system, can be expected. Furthermore, since floating capacitance associated with the wirings among the chips can also be simultaneously reduced, an improvement in signal transmission rate and a reduction in power consumed in transmission can be achieved.

The stacked chip system like this includes the heterogeneous stacking in which chips of different types are stacked and the homogeneous stacking in which the same chips are stacked. As an example of the heterogeneous stacking, a sensor chip system has been suggested. A chip having a sensor integrated thereon is arranged in an uppermost layer, an amplifier and an A/D converter are integrated in a lower layer, and a signal processing circuit and an IO circuit are integrated last. Further, a system in which a memory chip is stacked straight above (or straight below) a processor chip has also been suggested. In these systems, in addition to the reduction in transmission delay and the reduction in transmission electric power described above, a reduction in footprint area in chip vertical mounting and an improvement in band in data transmission by denser connection among the chips than a conventional connection can be expected.

On the other hand, in the homogeneous stacking, stacking of chips of the same type such as field programmable gate array (FPGA) and memory chips has been suggested. These chips have a feature of having a repeated structure even in one chip. In the homogeneous stacking, by increasing the number of stacks while suppressing the mask development cost, an improvement in gate size and memory capacity can be expected. This is referred to as stacking scalability. Further, as with the heterogeneous stacking, an improvement in performance resulting from the reduction in wiring delay and power consumption can also be expected.

Input and output of a signal to and from the stacked chip system are made by accessing a mounting board where this stacked chip system is mounted and a chip of a lowermost or uppermost layer. In practice, a pitch of through vias between stacked chips is several microns to 50 microns, and is narrower than an electrode pitch of BGA or the like used in the connection to the mounting board. For this reason, an interposer for pitch conversion is used. The interposer and the mounting board are connected with bumps. In a chip group constituting stacked chips, a chip in contact with this interposer is an access chip.

SUMMARY OF THE INVENTION

Meanwhile, in the technologies relating to semiconductor devices as described above, an IO circuit is generally mounted on a chip. The IO circuit defined herein is a portion where a signal exchanged between the chip and the mounting board is first processed on a chip side.

Here, a conventional IO circuit and its peripheral circuit are described with reference to FIG. 12. As depicted in FIG. 12, in the conventional IO circuit and its peripheral circuit, a signal inputted from an IO pad 1201 is coupled via an input buffer circuit 1204 to a core circuit 1205, and a signal outputted from the core circuit 1205 is coupled via an output driver circuit 1203 to the IO pad 1201. Although the input buffer circuit 1204 and the output driver circuit 1203 are both buffers as a logical function, since the output driver circuit 1203 in particular is required to drive a wiring on the board with a load capacitance of several pF to several tens pF, the channel width of a FET is formed to be as large as several hundreds µm.

Also, as an element circuit common to input and output, an ESD (Electrostatic Discharge) protective circuit 1202 made up of electrostatic-breakdown-preventive diodes is provided. This ESD protective circuit 1202 is also configured to be as large as the output driver circuit 1203 in order to maintain electrostatic breakdown resistance from outside of the chip. Therefore, the area of the IO circuit occupying the chip is not small. For example, in the case of a process of 65 nm, the ESD protective circuit 1202, the input buffer circuit 1204, and the output driver circuit 1203 are configured to have an area of 200 μm² to 300 μm².

Here, IO circuits in a stacked chip system are described. When the stacked chip system is formed by heterogeneous stacking, as described in Japanese Unexamined Patent Application Publication No. 9-92781 (Patent Document 2), IO circuits can be arranged in an access chip in a concentrated manner. A signal from a mounting board and a signal from each stacked chip are connected to each other via this access chip. Since the access chip and the other stacked chips are connected via through vias, it is sufficient for each stacked chip to have an IO circuit with a minimum size capable of driving the through vias with a load capacitance of several tens fF to several hundreds fF at most. Also, the ESD protective circuit for preventing electrostatic breakdown from outside of the system can be integrated on the access chip and can be omitted on each stacked chip.

On the other hand, in the case of homogeneous stacking, all of the stacked chips have the same layout, and each of them has an IO circuit. Therefore, after stacking, IO circuits integrated on chips other than the access chip are useless. That is, not all the IO circuits of the respective layers can be effectively used, or when the IO pads integrated on the respective stacked chips are all connected via through vias, an unnecessary capacitance of an ESD protective circuit is applied to decrease the IO performance.

Also in the case of homogeneous stacking, there may be the case where an access chip is newly created so that IO circuits are integrated thereon. Since the IO circuit can be eliminated from each stacked chip, area efficiency per chip is increased like in the heterogeneous stacking. Scalability can also be achieved where stacking of chips such as memory chips that share an IO signal in a bus system for transmission is concerned. As described in Japanese Unexamined Patent Application Publication No. 2009-295750 (Patent Document 3), this access chip is referred to as a memory controller.

However, the homogeneous stacking is still not suitable for stacked chips for which a logic size as that of an FPGA and scalability up to the number of IO pads corresponding to that size are required. For example, even when the IO circuit is moved from each layer to the access chip like in the memory chip, an increase in the number of IOs cannot be addressed. In particular, it can be thought in the FPGA that the number of stacks is changed in accordance with the logic size. Every time the number of stacks is changed, an access chip whose number of IOs is changed has to be designed. Thus, scalability for increasing the scale and performance by each stacking cannot be achieved at the portion of an IO circuit.

Therefore, a typical object of the present invention is to provide a semiconductor device capable of reducing the size of the IO circuit of each chip from a conventional size while maintaining driving capability and ESD resistance capability without newly fabricating an access chip in a stacked chip system, and capable of changing the number of IOs in accordance with the number of stacks in the entire stacked system.

The above and other objects and novel characteristics of the present invention will be apparent from the description of the present specification and the accompanying drawings.

The following is a brief description of an outline of the typical invention disclosed in the present application.

That is, the present invention is applied to a semiconductor device of a stacked chip system where a plurality of chips with the same design are stacked and the plurality of chips are electrically connected via through vias and placed on an interposer, and has features described below.

In the semiconductor device of the stacked chip system, in each chip, each IO terminal and one end of each IO circuit are connected, the other end of each IO circuit is connected to one end of each switch circuit to configure an IO channel, IO channels as many as the maximum scheduled number of stacks in the stacked chip system are coupled together by connecting the other ends of the respective switch circuits coupled at one point to one end of a core circuit, thereby configuring an IO group, and one or more such IO groups are provided. Each IO terminal has a structure receiving a through via, and each IO terminal is connected to an IO terminal at the same position in a chip of another layer via a through via. In the interposer, when the stacked chips are placed on the interposer, if the actual number of stacks is less than the maximum scheduled number of stacks, IO terminals in adjacent IO groups on the interposer are connected via a conductor.

Also, in another semiconductor device of a stacked chip system, in each chip, each IO terminal and one end of each IO circuit are connected, the other end of each IO circuit is connected to one end of a reconfigurable circuit to configure an IO channel, and one or more such IO channels are provided. Each IO terminal has a structure receiving a through via, and each IO terminal is connected to an IO terminal at the same position in a chip of another layer via a through via. In the reconfigurable circuit, when the stacked chips are placed on the interposer, the reconfigurable circuit also has a plurality of connection terminals having a structure receiving a through via, and a connection terminal is connected to a connection terminal at the same position as that of the reconfigurable circuit in a chip of another layer via a through via.

The effects obtained by typical embodiments of the invention disclosed in the present application will be briefly described below.

That is, in the semiconductor device of the stacked chip system, while maintaining driving capability and ESD resistance capability, the size of the IO circuit of each chip can be reduced from the conventional size to a value obtained by dividing the conventional size by the number of stacks. Also, as the number of stacks is increased, the number of IOs in the system can be scalably increased.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted.

General Outline of Embodiments of the Present Invention

Figure 1:
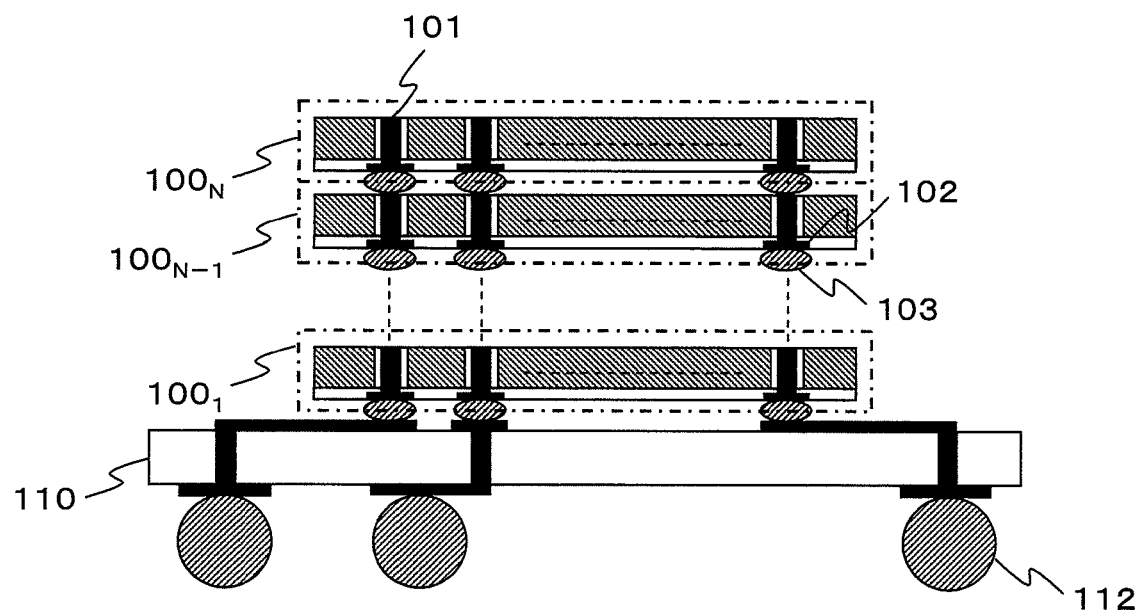
FIG. 1 is an explanatory diagram of a schematic section of a stacked chip system as an example of a semiconductor device according to embodiments of the present invention.

A semiconductor device according to embodiments of the present invention is a stacked chip system made up of a plurality of circuit chips which have the same design and are connected via through vias. A schematic section of this stacked chip system is depicted in FIG. 1. As depicted in FIG. 1, the stacked chip system is made up of a plurality of circuit chips 100 ($100_1$ to $100_N$) (example where the number of circuit chips is N is shown herein), an interposer 110, and others, and the system has the structure in which N circuit chips $100_1$ to $100_N$ are stacked in a longitudinal direction (vertical direction or an upward/downward direction) and the circuit chip $100_1$ of the lowermost layer is placed on the interposer 110.

In each of the circuit chips $100_1$ to $100_N$, through vias 101 penetrating in a longitudinal direction are buried, and on a lower side of each through via 101 (which may be on both lower and upper sides of each through via 101), a through silicon via (TSV) pad 102 exposed to a rear surface of each of the circuit chips $100_1$ to $100_N$ is provided.

When the N circuit chips $100_1$ to $100_N$ are stacked in the longitudinal direction, the TSV pad 102 of the circuit chip $100_N$ of the uppermost layer and the through via 101 of the circuit chip $100_{N-1}$ of a layer therebelow are connected via a solder bump for interchip connection 103, and after respective intermediate circuit chips are connected in the same manner, the TSV pad 102 of the circuit chip $100_1$ of the lowermost layer and a connection pad of the interposer 110 are connected via a solder bump 103. On a rear surface of the interposer 110, solder bumps 112 are provided for connecting the interposer and a mounting board.

In the structure of electrical connection between the circuit chips 100, the circuit chips are connected by the through vias 101 buried in the circuit chips 100, the TSV pads 102, and the solder bumps 103 connecting the circuit chips 100, and information and electric power are transmitted among the circuit chips 100. Each circuit chip 100 and the solder bumps 112 on the rear surface of the interposer 110 are electrically connected via wirings on the interposer 110.

In this manner, by connecting long-distance wirings for signals in the circuit chips 100 and signal wirings among the circuit chips 100 with through vias 101 each straight above the circuit chips 100, a significant reduction in wiring delay between elements in the circuit chip 100 and interchip transmission delay, which is a bottleneck in the entire system, can be expected. Furthermore, since floating capacitance associated with the wirings among the circuit chips 100 can also be simultaneously reduced, an improvement in signal transmission rate and a reduction in power consumed in transmission can be achieved.

Figure 2:
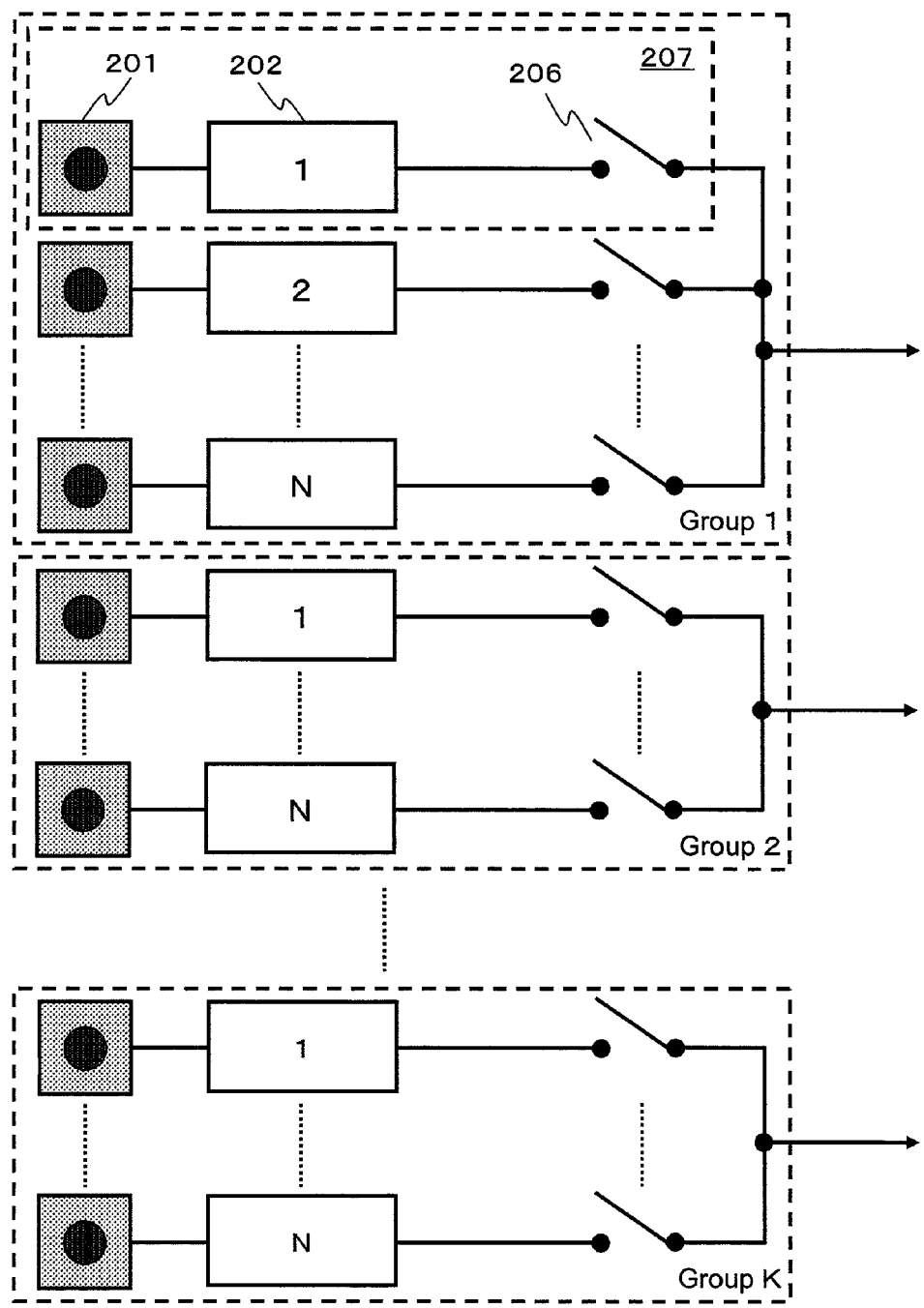
FIG. 2 is an explanatory diagram of IO circuits of each circuit chip and their peripheral circuits in the stacked chip system as an example of the semiconductor device according to the embodiments of the present invention.

Next, FIG. 2 depicts IO circuits of each stacked circuit chip and their peripheral circuits in the stacked chip system. As depicted in FIG. 2, in each circuit chip, in place of a conventional IO pad, a TSV pad for IO 201 with a structure receiving a through via is provided. Each circuit chip is provided with this TSV pad for IO 201, an IO circuit 202, an ON/OFF controllable switch circuit 206, and a core circuit (not shown), the TSV pad for IO 201 and one end of the IO circuit 202 are connected to each other, and the other end of this IO circuit 202 is connected to one end of the switch circuit 206 to configure an IO channel 207. A plurality of these IO channels 207 are provided. Here, for simplification of description, each IO circuit 202 includes an ESD protective circuit only.

The number of IO channels 207 is N which corresponds to the maximum scheduled number of stacks in the stacked chip system, and these IO channels 207 configure one IO group. All IO channels 207 in the IO group are individually coupled together via the respective ON/OFF controllable switch circuits 206 and are connected to a core circuit side by connecting the other ends of the respective switch circuits 206 to one point. The number of IO channels configured per circuit chip is N×K, where K represents the number of groups. Furthermore, the channel widths of a diode and a FET constituting the IO circuit 202 are reduced to 1/N of a conventional width. For example, a channel width of an electrostatic-breakdown-preventive diode constituting an ESD protective circuit is set between a value recommended in chip manufacturing specifications and a value obtained by dividing the recommended value by the maximum scheduled number of stacks N. Also, the channel width of a FET constituting an output driver circuit is set between a value recommended in the chip manufacturing specifications or any width value that is enough to drive a wiring on the mounting board and a value obtained by dividing the recommended value or the width value by the maximum scheduled number of stacks N.

Chips each having the IO circuits 202 and their peripheral circuits depicted in FIG. 2 are stacked in the following manner. When the number of chips to be stacked is the maximum number N, the TSV pads 201 on each row are connected via through vias in a vertical direction. Although the capability of the IO circuit 202 for one channel of each chip (here, resistance strength of the ESD protective circuit) is 1/N of a conventional circuit, since the chips as many as the scheduled number of stacks N are vertically connected in parallel, the capability is N×(1/N) per IO terminal when viewed from outside of the stacked chip system, which is equal to that of the conventional circuit. That is, the ESD protective circuits are shared in a vertical direction via through-via connection. Also, the number of IO channels 207 in each chip is N×K, which corresponds to the number of IOs usable in the stacked chip system with the through vias and the TSV pads 201. Among the switch circuits 206 of each layer, only one in the group is turned ON, and all of the others are turned OFF. Furthermore, the position of the switch circuit 206 that is turned ON differs depending on the layer. By this means, the IO channels 207 in the group connected to the through vias can be all allocated to different layers.

On the other hand, when the number of stacked chips is 1, all of the IO channels 207 in the same group are connected in parallel in a horizontal direction via wirings on the interposer. Although the capability of the IO circuit 202 for one channel of each chip (resistance strength of the ESD protective circuit) is 1/N of the conventional circuit, since N IO channels 207 in the group are connected in parallel in the horizontal direction, the resistance strength when viewed from outside of the stacked chip system is N×(1/N) per terminal of the IO circuit 202, which is equal to that of the conventional circuit. That is, the ESD protective circuits are shared in a horizontal direction via the wirings on the interposer. In this case, the number of usable IOs is K. If any one of the switch circuits 206 in the group is ON, a signal of the IO channel 207 can be coupled to the core circuit.

If the number of stacked chips is less than the maximum number N, vertical connection with the through vias and horizontal connection with the interposer are used in combination. For example, when the scheduled number of stacks is N/2, the TSV pads 201 in each row are connected with the through vias, and then two adjacent IO channels 207 are horizontally connected on the interposer. Although the resistance strength of the ESD protective circuits for one channel of each chip is 1/N of the conventional circuit, since N/2 IO channels 207 in each row are connected in parallel in a vertical direction and two IO channels 207 are connected in parallel in a horizontal direction, the capability of the IO circuit 202 when viewed from outside of the stacked chip system is N/2×2×(1/N) per channel, which is equal to that of the conventional circuit. That is, the ESD protective circuits are shared in the vertical direction via through-via connection and in the horizontal direction via the wirings on the interposer in combination. In this case, the number of usable IOs is N/2×K. Among the switch circuits 206 of each layer, any one of those horizontally connected with the interposer is turned ON, and such turned-ON switch circuits differ among the layers. By this means, the IO channels 207 in the group can be allocated to different layers.

With the above-described method, a stacked chip system can be configured only by changing the number of IOs in accordance with the number of stacked chips without decreasing IO capability and producing any unused IO circuit 202. Therefore, stacking scalability can be achieved.

While the case where the IO circuits 202 include only ESD preventive circuits has been described above, a similar connection method can be applied also to an input buffer circuit. When the method is applied to an input buffer circuit, the input buffer circuit is inserted between an ESD protective circuit and a switch circuit.

While the structure is made up of the IO circuit 202 and the explicit switch circuit 206 in the description above, in practice, this switch circuit may be included in a core circuit in a chip, for example, a reconfigurable circuit such as a programmable logic device typified by an FPGA.

Also, when the IO circuit includes an output buffer circuit (output driver circuit), the output buffer circuit is inserted between the switch circuit and the ESD protective circuit. However, since the output buffer circuit is required to have a capability of driving the outer wirings led from the stacked chips, it is shared among the chips like the ESD protective circuit. For simultaneously driving each output buffer circuit among the layers, not only through-via connection of the IO pads but also through-via connection of input terminals of the output buffer circuits is made to drive the plurality of output buffer circuits in tandem.

The embodiments based on the general outline of the embodiments of the present invention described above are each specifically described below. The embodiments described below are merely examples using the present invention, and the present invention is not restricted by the embodiments below.

First Embodiment

A first embodiment of the present invention is described with reference to FIG. 3 to FIG. 6. In the present embodiment, the case in which a digital signal input function is allocated to an IO terminal and an IO circuit is made up of an ESD protective circuit and an input buffer circuit is shown. In particular, the case shown in the present embodiment is an example in which the IO circuit includes an input buffer circuit.

Figure 3:
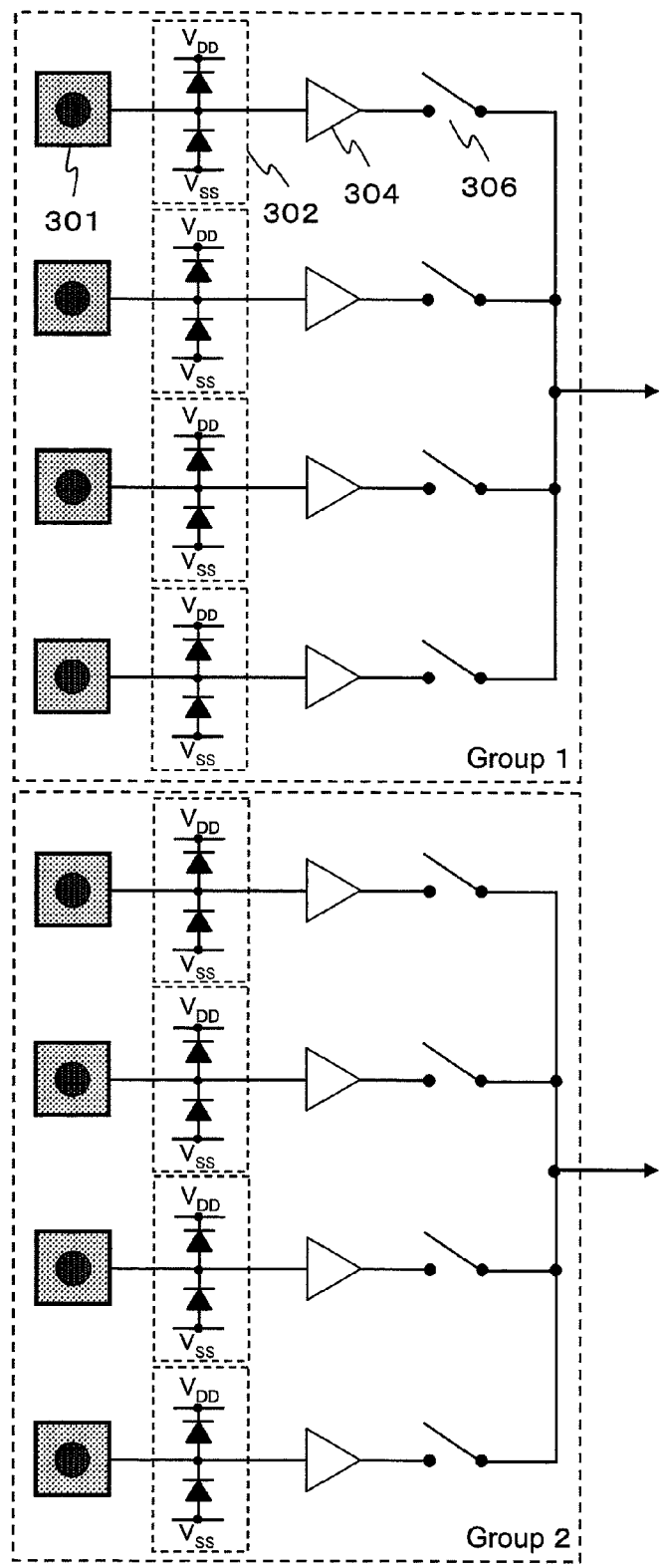
FIG. 3 is an explanatory diagram of the IO circuits per chip in a stacked chip system in a first embodiment of the present invention.

FIG. 3 depicts IO circuits per chip. In the present embodiment, the case in which the maximum scheduled number of stacks (N) is taken as four and the number of IO groups per chip (K) is taken as two is described. Four IO channels are configured as one group. One IO channel is made up of a TSV pad for IO 301 as an IO terminal, an ESD protective circuit 302, an input buffer circuit 304, and a switch circuit 306. Four IO channels in one group connected together via each of the switch circuits 306 are connected to a core circuit inside the chip. Each switch circuit 306 may be configured by using a general analog switch circuit, or the input buffer circuit 304 may be configured of a tristate buffer circuit so that the input buffer circuit itself has a switch function.

Figure 4:
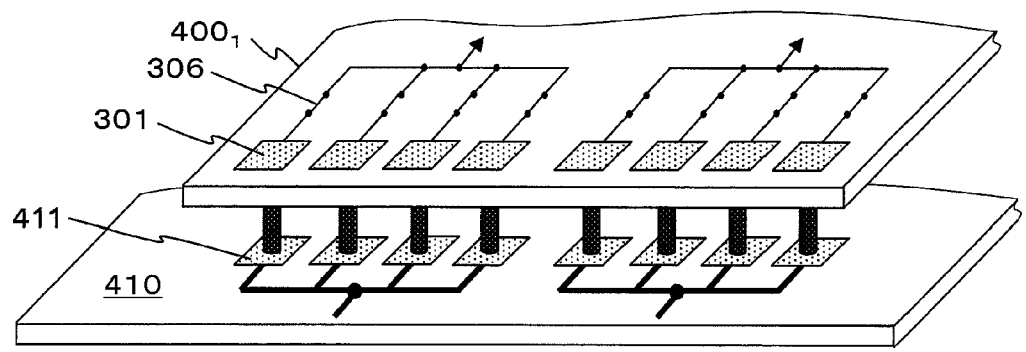
FIG. 4 is an explanatory diagram showing an example of an interchip connection (one layer) in the stacked chip system in the first embodiment of the present invention.
Figure 5:
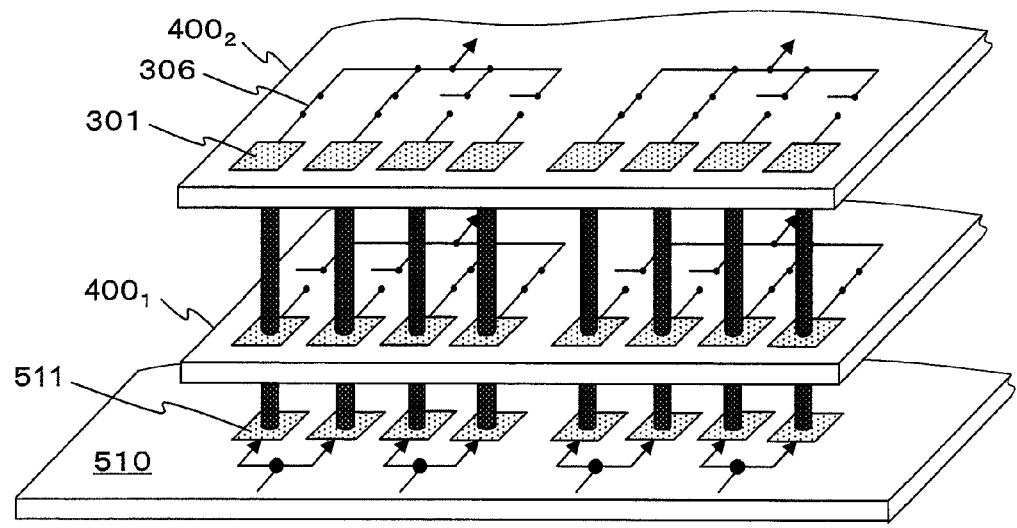
FIG. 5 is an explanatory diagram showing an example of an interchip connection (two layers) in the stacked chip system in the first embodiment of the present invention.
Figure 6:
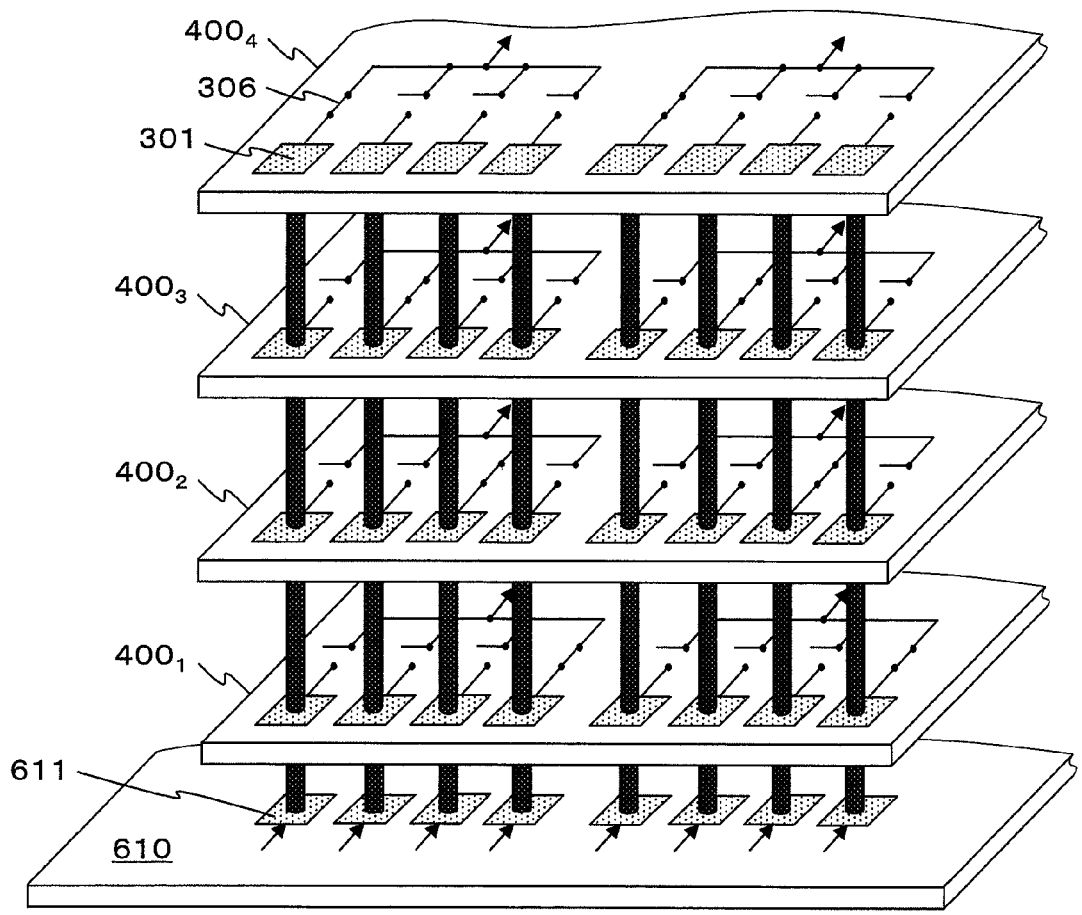
FIG. 6 is an explanatory diagram showing an example of an interchip connection (four layers) in the stacked chip system in the first embodiment of the present invention.

Next, an example of connection between the chips is described based on FIG. 4 to FIG. 6. Note that, in FIG. 4 to FIG. 6, for easy understanding of the connection between the chips, the through vias in the circuit chips are shown in an exposed state in the drawings, and solder bumps for interchip connection and solder bumps for connecting a chip and an interposer are omitted. Also, for simplification of description, only the TSV pads for IO 301 and the switch circuits 306 are shown in each circuit chip, and the input buffer circuits 304 are omitted.

FIG. 4 depicts an example of structure when a chip of one layer is stacked, that is, one chip is used. In this example of structure, a circuit chip 400 ($400_1$) is mounted on an interposer 410, and connection pads for IO 411 of four channels in one group are wired in parallel on an interposer 410 side (a connection pad 411 of a first channel, a connection pad 411 of a second channel, a connection pad 411 of a third channel, and a connection pad 411 of a fourth channel are connected with conductive wirings). The switch circuits 306 on the circuit chip $400_1$ are all ON. The number of IO channels when viewed from outside of the interposer 410 is two which corresponds to the number of groups in one chip. Similarly, although the load of the ESD protective circuit when viewed from outside is ¼ of a conventional load per chip, since four circuits are connected in parallel as a whole, the load is equal to the conventional load. Each input signal passes through the respective IO circuits in parallel for every four channels, and is coupled to a chip inner circuit via the switch circuit 306.

FIG. 5 depicts an example of structure when chips of two layers are stacked. In this example of structure, two circuit chips $400_1$ and $400_2$ are stacked on an interposer 510, the TSV pads for IO 301 of the respective circuit chips are connected with through vias, and then connection pads for IO 511 for every two channels in one group are wired in parallel on an interposer 510 side (a connection pad 511 of a first channel and a connection pad 511 of a second channel are connected with conductive wiring, and a connection pad 511 of a third channel and a connection pad 511 of a fourth channel are connected with conductive wiring). The number of IO channels per group is two, and the number of IO channels when viewed from outside of the interposer 510 is four. Similarly, although the load of the ESD protective circuit when viewed from outside is ¼ of a conventional load per chip, since two circuits are vertically connected and further two sets are horizontally connected in parallel as a whole, the load is equal to the conventional load. Each input signal passes through the respective IO circuits in parallel for each group, and is coupled to a chip inner circuit via the switch circuit 306. Among the switch circuits 306, those of the third and fourth channels in each group in the circuit chip $400_1$ of a first layer are ON, and those of the first and second channels in each group in the circuit chip $400_2$ of a second layer are ON.

FIG. 6 depicts an example of structure when chips of four layers which correspond to the maximum number of stacks are stacked. In this example of structure, on an interposer 610, four circuit chips $400_1$, $400_2$, $400_3$, and $400_4$ are stacked, and the TSV pads for IO 301 of each circuit chip are connected with through vias. On an interposer 610 side, connection pads for IO 611 are not connected to each other. The number of IO channels per group is four, and the number of IO channels when viewed from outside of the interposer 610 is eight. Similarly, although the load of the ESD protective circuit when viewed from outside is ¼ of a conventional load per chip, since four circuits are vertically connected in parallel as a whole, the load is equal to the conventional load. Each input signal passes through the respective IO circuits for each row, and is coupled to a chip inner circuit via the switch circuit 306. Among the switch circuits 306, those turned ON are different from each other (the switch circuit of a fourth channel for each group is ON in the circuit chip $400_1$ of a first layer, the switch circuit of a third channel for each group is ON in the circuit chip $400_2$ of a second layer, the switch circuit of a second channel for each group is ON in the circuit chip $400_3$ of a third layer, and the switch circuit of a first channel for each group is ON in the circuit chip $400_4$ of a fourth layer). Therefore, inputs of digital signals can be allocated to each layer.

As described above, by using the structure of the present embodiment (IO circuit is made up of the ESD protective circuit 302 and the input buffer circuit 304), it is possible to achieve a reduction in area of the IO circuit (ESD protective circuit 302) per chip and stacking scalability, that is, an increase of IO channels at each increase in the number of stacks while maintaining the load of the ESD protective circuit 302 to be constant. More specifically, the size of the IO circuit of each chip can be reduced from a conventional size to a value obtained by dividing the conventional size by the number of stacks, while maintaining the ESD resistance capability of the ESD protective circuit 302 constituting the IO circuit. Also, as the number of stacks is increased, the number of IOs in the system can be scalably increased.

Second Embodiment

A second embodiment of the present invention is described with reference to FIG. 7 and FIG. 8. In the present embodiment, the case in which a digital signal output function is allocated to an IO terminal and an IO circuit is made up of an ESD protective circuit and an output buffer circuit (output driver circuit) is shown. In particular, the present embodiment shows an example in which the IO circuit includes an input driver circuit, a signal input terminal (TSV pad for tandem driving 708) of the output driver circuit also has a structure receiving a through via, and this signal input terminal is connected via a through via to a signal input terminal of an output driver circuit at the same position in a chip of another layer.

Figure 7:
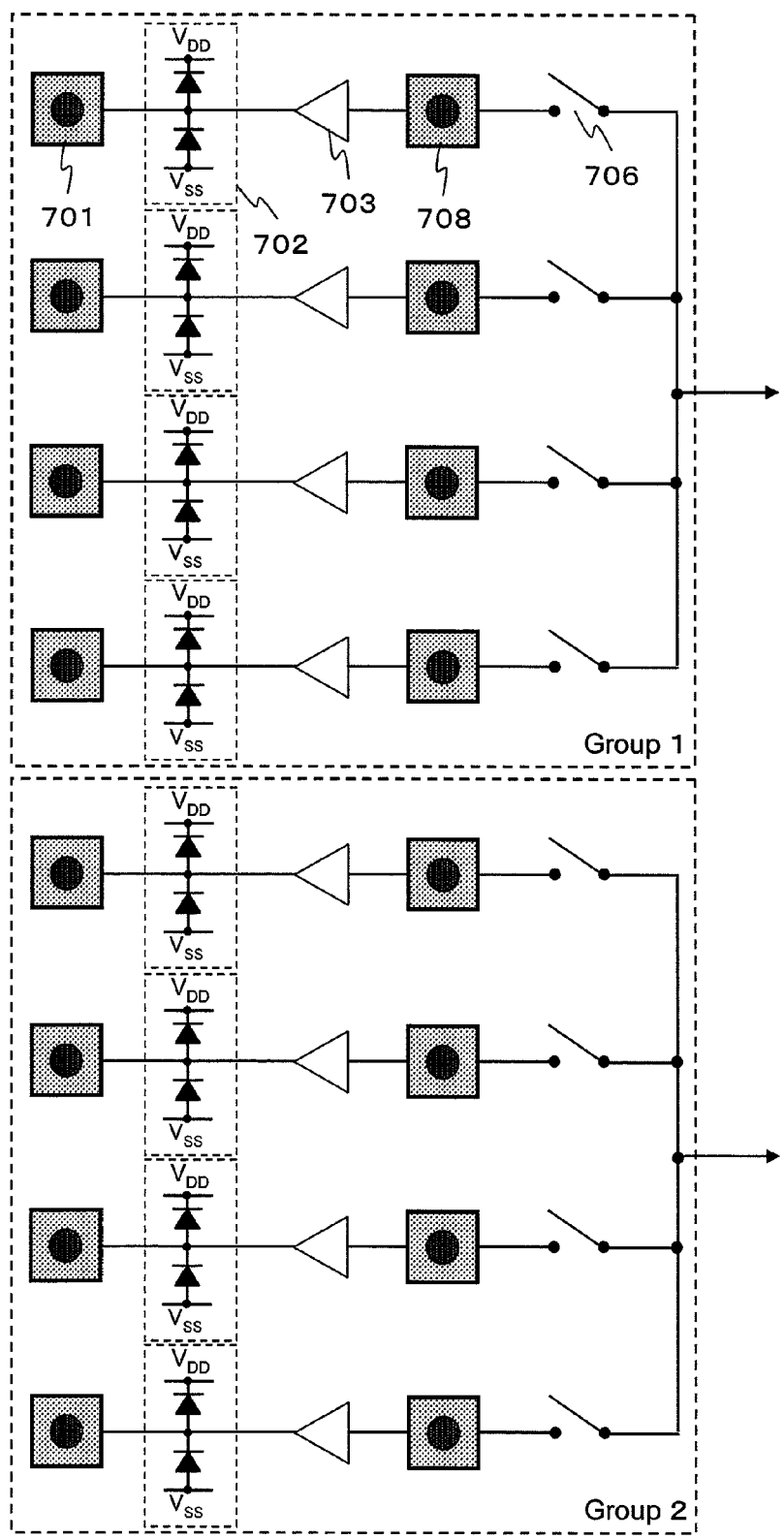
FIG. 7 is an explanatory diagram of the IO circuits per chip in a stacked chip system in a second embodiment of the present invention.

FIG. 7 depicts IO circuits per chip. In the present embodiment, as with the first embodiment, the case in which the maximum scheduled number of stacks (N) is four and the number of IO groups per chip (K) is two is described. Four IO channels are configured as one group. One IO channel is made up of a TSV pad for IO 701 as an IO terminal, an ESD protective circuit 702, an output buffer circuit 703, another TSV pad for tandem driving 708, and a switch circuit 706. Four IO channels in one group coupled together via the switch circuits 706 are connected to a core circuit inside the chip. Each switch circuit 706 may be configured by using a general analog switch circuit, or the output buffer circuit 703 may be configured of a tristate buffer circuit so that the output buffer circuit itself has a switch function.

Compared with the first embodiment described above, the TSV pad 708 is added because the IO circuits connected in parallel, in this case, the output buffer circuits 703 are driven in tandem. More specifically, after input terminals and output terminals of the plurality of (M) output buffer circuits 703 are connected with TSV pads 708 and 701 and the same digital signals are inputted, the output driving capability is multiplied by M corresponding to the number of connections. By this method, even if the driving capability of the output buffer circuit 703 per chip is 1/N of conventional capability, it is M/N-fold in the whole system. As described in the parallel connection of the ESD protective circuits in the first embodiment, with respect to the maximum number of stacks N, by the vertical connection with the through vias and the parallel connection with the wirings on the interposer, the driving capability can be made equal to the conventional one.

As with the first embodiment described above, in the present embodiment, stacking scalability can be achieved by the wirings on the interposer and the control of the switch circuits 706 on each chip in accordance with the number of stacked chips. Since the method for this is similar to that of the first embodiment described above (FIG. 4 to FIG. 6), this is not described herein.

Figure 8:
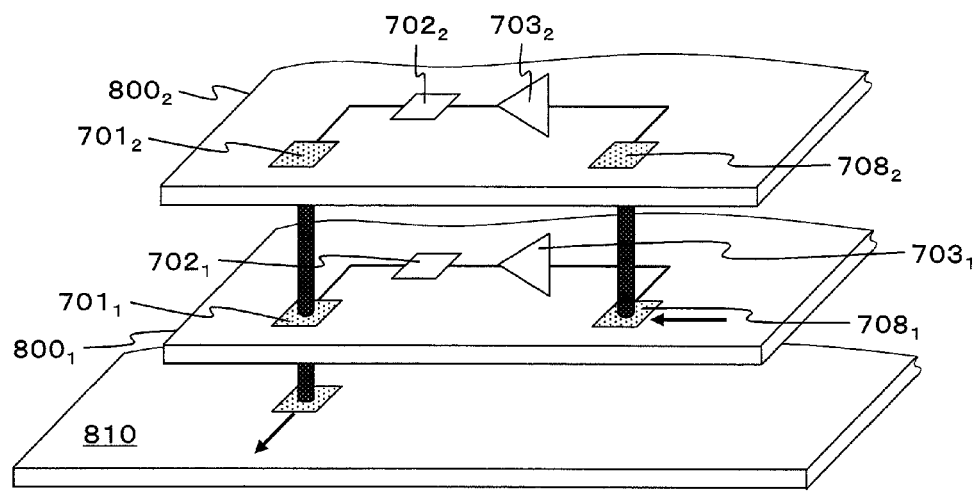
FIG. 8 is an explanatory diagram of the structure achieving tandem driving of output buffer circuits in the stacked chip system in the second embodiment of the present invention.

FIG. 8 depicts the structure for achieving tandem driving of the output buffer circuits 703 when the number of stacked chips is two. Note that, as with FIG. 4 to FIG. 6, also in FIG. 8, for easy understanding of interchip connection, through vias in circuit chips are shown in an exposed state in the drawing, and solder bumps for interchip connection and solder bumps for connecting a chip and the interposer are omitted.

In this example of structure, two circuit chips $800_1$ and $800_2$ are stacked on an interposer 810, TSV pads for IO 701 in each circuit chip are connected with the through vias, and then an input of each output buffer circuit 703 is connected with another through via to a TSV pad for tandem driving 708. FIG. 8 depicts an example in which a signal from a core circuit of the circuit chip $800_1$ of a first layer counted from below is output to outside of the chip. The signal from the core circuit of the circuit chip $800_1$ of the first layer is inputted via a through via between the TSV pads for tandem driving $708_1$ and $708_2$ not only to an output buffer circuit $703_1$ of the first layer but also to an output buffer circuit $703_2$ of a second layer. Therefore, the two output buffer circuits $703_1$ and $703_2$ can be simultaneously driven. Outputs from the respective output buffer circuits 703 are coupled together via a through via between TSV pads for IO $701_2$ and $701_1$ and outputted via the interposer 810.

As described above, by using the structure of the present embodiment (IO circuit is made up of the ESD protective circuit 702 and the output buffer circuit 703), the size of an IO circuit of each chip can be reduced from a conventional size to a value obtained by dividing the conventional size by the number of stacks, while maintaining the driving capability of the output buffer circuit 703 constituting the IO circuit and the ESD resistance capability of the ESD protective circuit 702. Also, as the number of stacks is increased, the number of IOs in the system can be scalably increased.

Third Embodiment

A third embodiment of the present invention is described below with reference to FIG. 9 and FIG. 10. In the present embodiment, the case in which a digital signal input and output function is allocated to an IO terminal and an IO circuit is made up of an ESD protective circuit and an input/output buffer circuit is shown. In particular, the present embodiment shows an example in which the IO circuit includes an input/output buffer circuit having an input buffer circuit and an output driver circuit, a signal input terminal (TSV pad for tandem driving 908) of the output driver circuit also has a structure receiving a through via, this signal input terminal is connected via a through via to a signal input terminal of an output driver circuit at the same position in a chip of another layer, a direction selecting terminal (TSV pad 909 for selecting an input/output buffer circuit direction) that makes any of the input buffer circuit and the output driver circuit active also has a structure receiving a through via, and this direction selecting terminal is connected to a direction selecting terminal at the same position in a chip of another layer via a through via.

Figure 9:
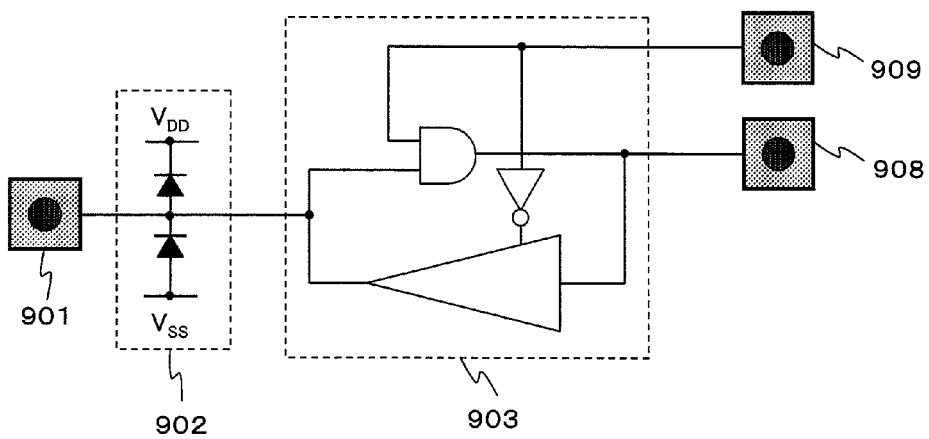
FIG. 9 is an explanatory diagram of IO circuits for one channel in a stacked chip system in a third embodiment of the present invention.

FIG. 9 depicts IO circuits for one channel for simplification of description. One IO channel is made up of a TSV pad for IO 901 as an IO terminal, an ESD protective circuit 902, an input/output buffer circuit 903, and other two TSV pads, that is, a TSV pad 908 for tandem driving and a TSV pad 909 for selecting an input/output buffer circuit direction. Compared with the first embodiment described above, the TSV pad 908 is added because, as described in the second embodiment, IO circuits connected in parallel, in this case, the input/output buffer circuits 903 are driven in tandem. Furthermore, the TSV pad 909 for controlling the selection of a direction of this input/output buffer circuit 903, that is, an input or an output is added. The TSV pad 909 is added in order to match the function of the input/output buffer circuits 903 to be driven in tandem.

Figure 10:
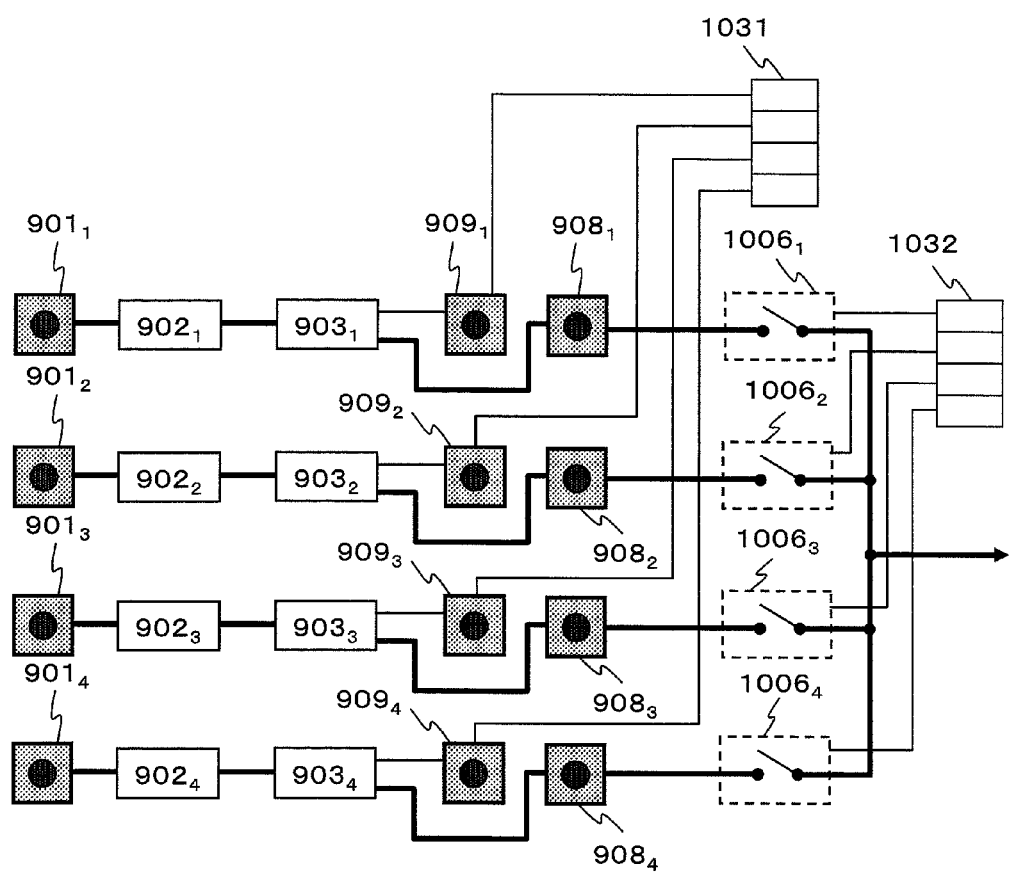
FIG. 10 is an explanatory diagram of IO circuits including a control circuit per chip in the stacked chip system in the third embodiment of the present invention.

FIG. 10 depicts IO circuits including a control circuit per chip. As for the IO circuits including the control circuit, the case in which the maximum scheduled number of stacks (N) is four and the number of IO groups (K) per chip is one is described. In this case, four IO channels are configured as one group. One IO group is made up of TSV pads for IO 901 ($901_1$ to $901_4$) as IO terminals, the ESD protective circuits 902 ($902_1$ to $902_4$), the input/output buffer circuits 903 ($903_1$ to $903_4$), the TSV pads 908 ($908_1$ to $908_4$) for driving the input/output buffer circuits 903 in tandem, the TSV pads 909 ($909_1$ to $909_4$) for determining the direction of the input/output buffer circuits 903 depicted in FIG. 9, and switch circuits 1006 ($1006_1$ to $1006_4$), an IO-circuit-direction selecting register 1031, and a switch circuit control register 1032. Four IO channels in one group coupled together via the switch circuits 1006 are connected to the inside of the chip. Each switch circuit 1006 may be configured by using a general analog switch circuit, or the input/output buffer circuit 903 may have a switch function. In FIG. 10, a path of an input signal from each TSV pad for IO 901 and a path of an output signal from the chip inner circuit are each indicated by a thick line.

The switch circuit control register 1032 turns ON/OFF each of the switch circuits $1006_1$ to $1006_4$ independently. As described in the first embodiment above, the switch circuit control register 1032 controls each switch circuit 1006 to associate the TSV pads for IO 901 and inner circuits of each layer with each other in accordance with the number of stacks. The IO-circuit-direction selecting register 1031 independently determines a direction of each input/output buffer circuit 903 (either one of the input buffer circuit and the output buffer circuit). In order to match all directions of the plurality of input/output buffer circuits 903 driven in tandem in each layer, corresponding details of control are written also in this IO-circuit-direction selecting register 1031. Furthermore, when the input/output buffer circuits 903 are driven in tandem across the layers, the details of control of the IO-circuit-direction selecting register 1031 in each layer are matched, or a signal for determining a direction is supplied to each layer via the TSV pads 909.

As described above, by using the structure of the present embodiment (IO circuit is made up of the ESD protective circuit 902 and the input/output buffer circuit 903), the size of the IO circuit of each chip can be reduced from the conventional size to a value obtained by dividing the conventional size by the number of stacks while maintaining the driving capability of the input/output buffer 903 constituting the IO circuit and the ESD resistance capability of the ESD protective circuit 902. Also, as the number of stacks is increased, the number of IOs in the system can be scalably increased.

Note that when the IO circuit includes an input/output buffer circuit like the present embodiment, the IO circuit can be configured with separating an input buffer circuit and an output driver circuit from each other. Also in this case, similar effects can be expected.

Fourth Embodiment

A fourth embodiment of the present invention is described below with reference to FIG. 11. In the present embodiment, as with the third embodiment described above, the case in which a digital signal input and output function is allocated to an IO terminal and an IO circuit is made up of an ESD protective circuit and an input/output buffer circuit is shown.

The present embodiment is different from the third embodiment described above in the following points. That is, in place of a switch circuit, a reconfigurable circuit (FPGA circuit 1140) is included in a core circuit, this reconfigurable circuit has a plurality of connection terminals (TSV pads for FPGA three dimensionalization 1151) each having a structure receiving a through via, and each connection terminal is connected with a through via to a connection terminal at the same position as that of a reconfigurable circuit in a chip of another layer. Furthermore, the present embodiment shows an example in which the IO circuit includes an input/output buffer circuit having an input buffer circuit and an output driver circuit and the reconfigurable circuit includes a circuit for connecting a signal input terminal of an output driver circuit to a signal input terminal of an output driver circuit at the same position in a chip of another layer and a circuit for connecting a direction selecting terminal that makes either one of the input buffer circuit and the output driver circuit active to a direction selecting terminal at the same position in a chip of another layer.

Figure 11:
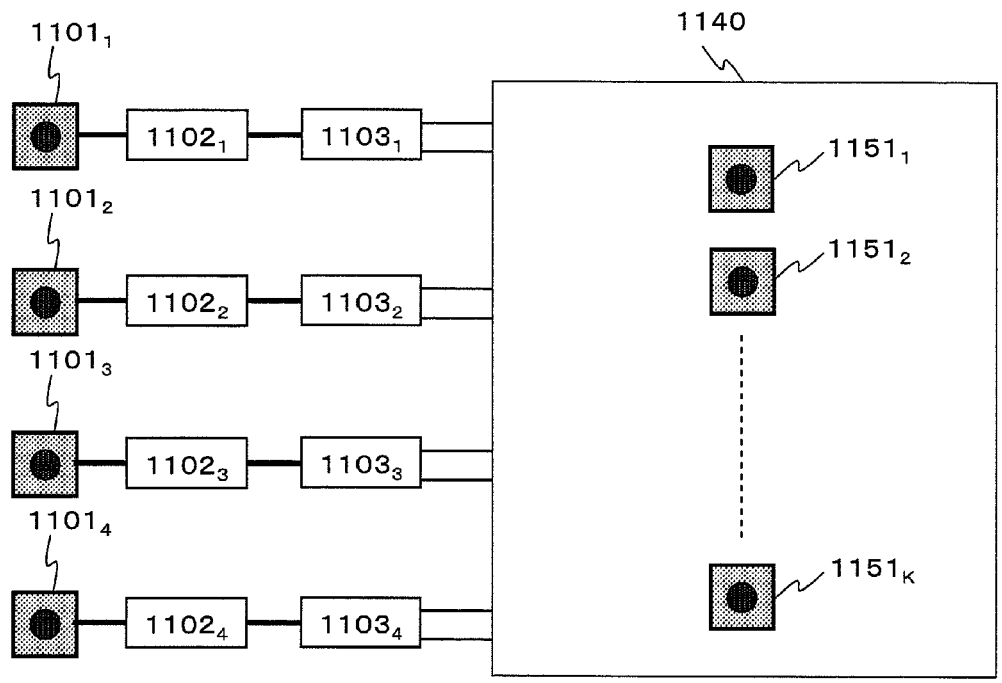
FIG. 11 is an explanatory diagram of the IO circuits per chip in a stacked chip system in a fourth embodiment of the present invention.
Figure 12:
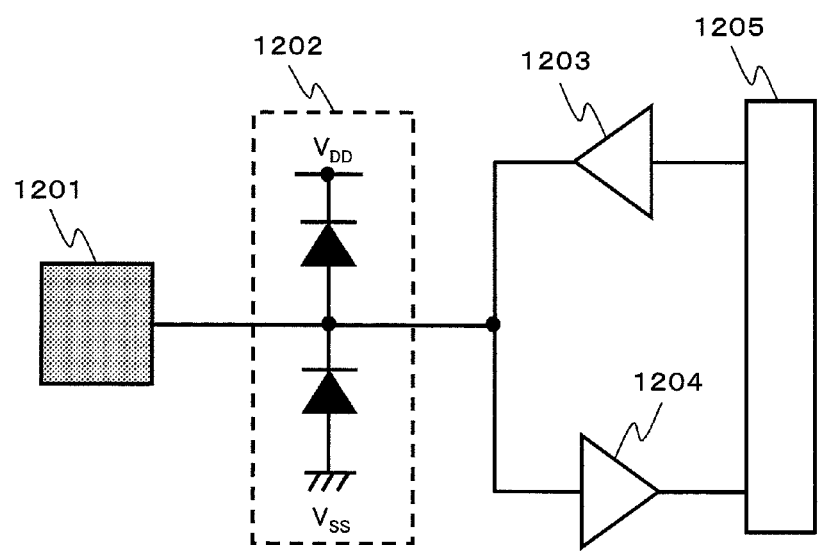
FIG. 12 is an explanatory diagram of a conventional IO circuit and its peripheral circuit.

FIG. 11 shows the structure of the IO circuit. Unlike the third embodiment described above, the IO circuit is made up of TSV pads for IO 1101 ($1101_1$ to $1101_4$), ESD protective circuits 1102 ($1102_1$ to $1102_4$), input/output buffer circuits 1103 ($1103_1$ to $1103_4$), and the FGPA circuit 1140 having the TSV pads for FPGA three dimensionalizaion 1151 (1151$_1$ to 1151$_K$). Unlike the first to third embodiments described above, in place of switch circuits coupled to the input/output buffer circuits 1103, the FPGA circuit 1140 is provided in the core circuit, and a direct input is made from the input/output buffer circuits 1103 to the FPGA circuit 1140 and from the FPGA circuit 1140 to the input/output buffer circuits 1103.

The FPGA circuit 1140 has a three-dimensional structure in which the TSV pads for FPGA three dimensionalization 1151 are connected in each layer at the time of stacking. Since sharing of an input signal among the layers by the input/output buffer circuits 1103 to be driven in tandem is made inside the FPGA circuit 1140 where the TSV pads for FPGA three dimensionalization 1151 are connected, no TSV pad is directly connected to an input side of the input/output buffer circuits 1103, and no switch circuit is present either. The FPGA circuits 1140 of the respective layers are in cooperation with each other via through vias to directly input a signal outputted from the FPGA circuits 1140 of each layer to the input/output buffer circuits 1103. To the input/output buffer circuits 1103 to be driven in tandem among layers, signals having truth values matching with each other are inputted, and the input/output buffer circuits 1103 are controlled in the directions matching with each other.

As described above, by using the structure of the present embodiment (the IO circuit is made up of the ESD protective circuit 1102 and the input/output buffer circuit 1103 and the FPGA, circuit 1140 is provided in place of switch circuits), the size of the IO circuit of each chip can be reduced from the conventional size to a value obtained by dividing the conventional size by the number of stacks while maintaining driving capability of the input/output buffer circuit 1103 constituting the IO circuit and ESD resistance capability of the ESD protective circuit 1102. Also, as the number of stacks is increased, the number of IOs of the system can be scalably increased.

Note that while the case in which the input/output buffer circuit 1103 is controlled by the FPGA circuit 1140 having a three dimensional structure has been described in the present embodiment, the present invention can also be applied to the case in which the input buffer circuit constituting an IO circuit is controlled as in the first embodiment described above, the case in which the output buffer circuit constituting an IO circuit is controlled as in the second embodiment described above, and the case in which the input buffer circuit and the output driver circuit are separated and both circuits are controlled.

Furthermore, the present embodiment may be applied to, in addition to an FPGA circuit, a plurality of microprocessors, memories, and simple sequential circuits connected with through vias among layers.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a semiconductor device in which chips in which a microprocessor and a memory are integrated are stacked, and in particular, it can be used for an interchip connection technology in a stacked chip system of homogeneous stacking where a plurality of chips of the same design are stacked.

What is claimed is:

1. A semiconductor device, comprising:
a plurality of chips of the same type; and
an interposer, including a plurality of connection pads, on which the plurality of chips are homogeneously stacked in a number of layers,
wherein the number of layers is between one and a scheduled number of layers N,
wherein each chip has a plurality of IO terminals, a plurality of IO circuits, a plurality of ON/OFF controllable switch circuits, and a core circuit,
wherein each chip has one or more IO groups connected to the core circuit, each IO group includes a plurality of IO channels equal to the scheduled number of layers N, and each IO channel is formed from an IO terminal, an IO circuit and a switch circuit,
wherein each connection pad is connected to a corresponding IO terminal in a chip of an adjacent layer using a through via,
wherein, when the number of layers is more than one, each IO terminal is connected to a corresponding IO terminal in a chip of an adjacent layer using a through via, and
wherein the scheduled number of layers N is four or more.

2. The semiconductor device according to claim 1,
wherein each of the IO circuits includes an electrostatic-breakdown-preventive diode, and
a channel width of the electrostatic-breakdown-preventive diode is smaller than a recommended value for the IO circuit.

3. The semiconductor device according to claim 2,
wherein each of the IO circuit further includes an input buffer circuit.

4. The semiconductor device according to claim 2,
wherein the channel width is equal to the recommended value divided by the scheduled number of layers N.

5. The semiconductor device according to claim 1,
wherein, when the number of layers is one, the connection pads corresponding to the IO terminals in each IO group are connected together in parallel, and all of the switch circuits in each IO group are turned ON in the layer.

6. The semiconductor device according to claim 1,
wherein, when the number of layers is more than one and less than the scheduled number of layers N, the connection pads corresponding to the IO terminals in each IO group are connected together in parallel sets, one set of switch circuits in each IO group is turned ON in each layer and the remaining sets of switch circuits in each IO group are turned OFF in each layer.

7. The semiconductor device according to claim 1,
wherein, when the number of layers is equal to the scheduled number of layers N, the connection pads corresponding to the IO terminals in each IO group are not connected together, one of the switch circuits in each IO group is turned ON in each layer and the remaining switch circuits in each IO group are turned OFF in each layer.

8. The semiconductor device according to claim 3,
wherein each IO channel includes a tandem drive IO terminal connected between the output buffer circuit and the switch circuit, and
wherein each tandem drive IO terminal is connected to a corresponding tandem drive IO terminal in a chip of an adjacent layer using a through via.

9. The semiconductor device according to claim 8,
wherein each IO channel includes an input buffer circuit coupled to the output buffer circuit to form a switchable input/output buffer circuit, and a direction selecting terminal connected to the switchable input/output buffer circuit, and wherein each direction selecting terminal is connected to a corresponding direction selecting terminal in a chip of an adjacent layer using a through via.

10. The semiconductor device according to claim 9,
wherein the direction selecting terminals are connected to a direction selection register, and
wherein the switch circuits are connected to a switch control register.

11. A semiconductor device, comprising:
a plurality of chips of the same type; and
an interposer, including a plurality of connection pads, on which the plurality of chips are homogeneously stacked in a number of layers,
wherein the number of layers is between one and a scheduled number of layers N,
wherein each chip has a plurality of IO terminals, a plurality of IO circuits and a core circuit including a reconfigurable circuit having a plurality of connection terminals,
wherein each chip has one or more IO groups connected to the core circuit, each IO group includes a plurality of IO channels equal to the scheduled number of layers N, and each IO channel is formed from one IO terminal and one IO circuit,
wherein each connection pad is connected to a corresponding IO terminal in a chip of an adjacent layer using a through via,
wherein, when the number of layers is more than one, each IO terminal is connected to a corresponding IO terminal in a chip of an adjacent layer using a through via, and each connection terminal is connected to a corresponding connection terminal in a chip of an adjacent layer using a through via, and
wherein the scheduled number of layers N is four or more.

12. The semiconductor device according to claim 11,
wherein each of the IO circuits includes an electrostatic-breakdown-preventive diode, and
wherein a channel width of the electrostatic-breakdown-preventive diode is smaller than a recommended value for the IO circuit.

13. The semiconductor device according to claim 12,
wherein each of the IO circuit further includes an input buffer circuit.

14. The semiconductor device according to claim 12,
wherein the channel width is equal to the recommended value divided by the scheduled number of layers N.

15. The semiconductor device according to claim 11,
wherein, when the number of layers is one, the connection pads corresponding to the IO terminals in each IO group are connected together in parallel.

16. The semiconductor device according to claim 11,
wherein, when the number of layers is more than one and less than the scheduled number of layers N, the connection pads corresponding to the IO terminals in each IO group are connected together in parallel sets.

17. The semiconductor device according to claim 11,
wherein, when the number of layers is equal to the scheduled number of layers N, the connection pads corresponding to the IO terminals in each IO group are not connected together.

18. The semiconductor device according to claim 11,
wherein the reconfigurable circuit is a field programmable gate array (FPGA).

\* \* \* \* \*